United States Patent [19]

Chang et al.

[11] Patent Number: 5,012,064
[45] Date of Patent: Apr. 30, 1991

[54] ELECTRON BEAM EVAPORATION SOURCE

[75] Inventors: Ping Chang, Danville; P. A. Joel Smith, San Pablo, both of Calif.

[73] Assignee: The BOC Group, Inc., New Providence, N.J.

[21] Appl. No.: 546,269

[22] Filed: Jun. 29, 1990

[51] Int. Cl.⁵ .............................................. B23K 15/00
[52] U.S. Cl. .......................... 219/121.15; 219/121.28; 373/14
[58] Field of Search ....................... 219/121.15, 121.16, 219/121.17, 121.26, 121.28, 121.29, 121.3; 373/11, 12, 13, 14

[56] References Cited

U.S. PATENT DOCUMENTS 3,710,072  1/1973  Shrader et al. ............... 219/121.15
4,131,753  12/1978  Tsujimoto et al. ................... 373/11

Primary Examiner—C. L. Albritton
Attorney, Agent, or Firm—Robert I. Pearlman; David M. Rosenblum

[57] ABSTRACT

The present invention provides an electron beam evaporation source designed so that the size of the impact area of the electron beam on an evaporant will remain essentially constant in any position of the impact area on the evaporant; and thus, the rate of evaporation will remain essentially constant. To this end, a quadrapole comprising a set of two pairs of electromagnets is used to deflect the electron beam. The quadrapoles provide a uniform magnetic deflection field to prevent distortion of the impact area. A pair of pole pieces, used in deflecting the electron beam through an arc of 270 degrees, are provided with a predetermined thickness and spacing to prevent lengthening of the impact area parallel to the pole pieces as the electron beam is deflected parallel to the pole pieces. The pole pieces, however, produce the formation of tail regions in the impact area when the impact area is positioned near the pole pieces. In order to eliminate such tail regions, a pair of surface dipoles are connected to the pole pieces at an angle of 45 degrees such that the electron beam passes between the ends of the dipoles at a near vertical location of the arc of the electron beam. The maintenance of the impact area essentially free of distortion, tail region formation, and lengthening, ensures essential consistency in the size of the impact areas.

5 Claims, 5 Drawing Sheets

ELECTRON BEAM EVAPORATION SOURCE

BACKGROUND OF THE INVENTION

The present invention relates to electron beam evaporation sources wherein an evaporant contained within a crucible is evaporated by an electron beam for deposition onto a substrate. Even more particularly, the present invention relates to an electron beam evaporation source in which the electron beam is vertically deflected into the crucible, through an arc of about 270 degrees, and is deflected in a horizontal plane for impact at predetermined points on the top surface of the evaporant in order to fully utilize the evaporant.

The prior art has provided electron beam evaporation sources that are used in depositing metallic and nonmetallic materials onto a substrate such as in the manufacture of integrated circuits, the coating of ophthalmic lenses, etc. A common design of an electron beam evaporation source utilizes a crucible for containing the material to be evaporated, such material being referred to in the art as an evaporant, and an electron beam emitted by an emitter of an electron beam gun that is vertically deflected through an arc of 270° and into the crucible. The electron beam is vertically deflected by a transverse magnetic field produced by a pair of elongated pole pieces located on opposite sides of the crucible and transversely connected by a permanent magnet. The electron beam gun is located beneath a cover plate connecting the pole pieces in order to prevent the evaporant from spattering onto the emitter.

One important application for electron beam evaporation sources is in molecular beam epitaxy (MBE) in which a thin layer of evaporant is slowly and uniformly deposited onto a substrate in an ultra high vacuum environment, that is in a vacuum environment of $10^{-8}$ torr and below. MBE depositions are utilized for providing uniform doping layers at the junctions of semiconductors and also, in the manufacture of layered integrated circuits. Another important application of electron beam evaporation sources is in the manufacture of ophthalmic lenses. In such application, many thin and uniform layers of evaporant are deposited onto a lens in a high vacuum environment, that is in a vacuum environment of $10^{-7}$ torr and above. In both of such applications, a large crucible is utilized, typically having a volume of 150 cc and above. In the case of MBE the large crucible is utilized because it normally takes about two weeks to achieve an ultra high vacuum; and thus, it is not practical to stop production and to replenish the crucible before the evaporant has been fully utilized. In ophthalmic lens manufacturing technology the large crucible is utilized because of the amount of evaporant to be deposited.

In any electron beam evaporation source, the electron beam bores into the evaporant at the impact point of the electron beam on the evaporant. This is particularly the case when the evaporant comprises a subliming material such as silica. Thus, in order to fully utilize the evaporant in the crucible, particularly in a large crucible employed in the foregoing applications, the electron beam is deflected in a horizontal plane, namely in a plane at right angles to the pole pieces or more exactly, one extending across the crucible. Such deflection is accomplished in a predetermined manner in order to selectively reposition the impact point of the electron beam on the evaporant. To this end, the prior art has provided for the electromagnetic deflection of the electron beam through the use of a U-shaped arrangement of electromagnets located adjacent to the emitter of the electron beam gun. The electromagnets are differentially energized in order to deflect the electron beam in a horizontal plane.

The problem associated with deflecting the electron beam in a horizontal plane is that the impact area of the electron beam on the top surface of the evaporant distorts in dependence on the position of the impact area. Such distortion of the electron beam is produced by nonuniformities in the magnetic field vertically deflecting the electron beam through the arc of 270 degrees and in the magnetic field of the U-shaped electromagnets used in deflecting the electron beam in a horizontal plane. As a result of this problem, the power density of the electron beam at the impact area and thus, the rate of evaporation, changes in dependence upon the position of the impact area. This problem is particularly critical in MBE and ophthalmic coating in which uniformity in the thickness of the deposited layers is required. Thus, in the prior art, relatively complex monitoring systems are required to monitor the evaporation rate of the evaporant and to accordingly adjust the power density of the electron beam in each position of the electron beam so that the evaporation rate remains constant.

As will be discussed, the present invention solves the differential evaporation rate problem associated with the deflection of the electron beam in the horizontal plane by providing an electron beam evaporation source in which the size of the impact area of the electron beam remains essentially constant in any selected position of the impact area. Since the size of the impact area remains substantially uniform, the power density of the beam at the impact point of the electron beam on the evaporant remains essentially constant as does the evaporation rate of the evaporant.

SUMMARY OF THE INVENTION

The present invention provides an electron beam evaporation source having a crucible for containing the evaporant, electron beam gun means, a pair of pole pieces and magnetic positioning means. The electron beam gun means generate an electron beam impacting the evaporant at an impact area thereof for evaporating the evaporant. The pole pieces are located along opposite sides of the crucible and the magnetic field means transversely connect the pole pieces and generate a magnetic field across the pole pieces for vertically deflecting the electron beam through an arc of about 270 degrees and into the crucible. The magnetic positioning means selectively deflect the electron beam in a horizontal plane so that the impact area of the electron beam on the evaporant may be repositioned in order to fully utilize the evaporant.

The magnetic deflection means comprises a quadrapole having a set of two opposite pairs electromagnets attached end to end in a square-like configuration and located such that the electron beam passes between the two pairs of electromagnets. The two pairs of electromagnets are wired and oriented such that the electromagnets of one of the pairs of electromagnets act in concert to deflect the electron beam in a first direction, parallel to the pole pieces, and the electromagnets of the other of the pairs of electromagnets act in concert to deflect the electron beam in a second direction, transverse to the pole pieces. As a result, the electromagnets provide a substantially uniform magnetic deflection field to horizontally deflect the electron beam and to prevent substantial disortion of the impact area when repositioned.

Even with the quadrapole, the impact area lengthens when the electron beam is horizontally deflected in the first direction and away from the electron beam gun means. In order to prevent such lengthening of the impact area, the pole pieces are designed with a preselected thickness and a preselected separation to produce a reduced vertical gradient in the flux density of the magnetic field above the electron beam evaporation source.

The pole pieces, however, produce the formation of tail regions in the impact area at extreme transverse positions of horizontal deflection of the electron beam in the second direction. This problem is corrected by a pair of surface dipoles connected, at one end, to the pole pieces at an angle of about 45 degrees. The surface dipoles are positioned along the pole pieces such that the electron beam passes between the other of the ends of the pair of surface dipoles when in an essentially vertical location of the arc of the electron beam.

The maintenance of the impact area substantially free of distortion, lengthening and the formation of tail regions insures that the size of the impact area will remain essentially constant. As a result, the power density of the electron beam at the impact point of the electron beam on the evaporant will remain essentially constant and therefore, the evaporation rate of the evaporant. As such, the present invention does not require complex prior art monitoring devices to monitor and adjust the evaporation rate of the evaporant for consistancy.

BRIEF DESCRIPTION OF THE DRAWINGS

While the specification concludes with claims particularly pointing out the subject matter that applicants regard as their invention, it is believed that the invention will be better understood from the following description taken in conjunction with the accompanying drawings in which:

DETAILED DESCRIPTION OF THE INVENTION

Figure 1:
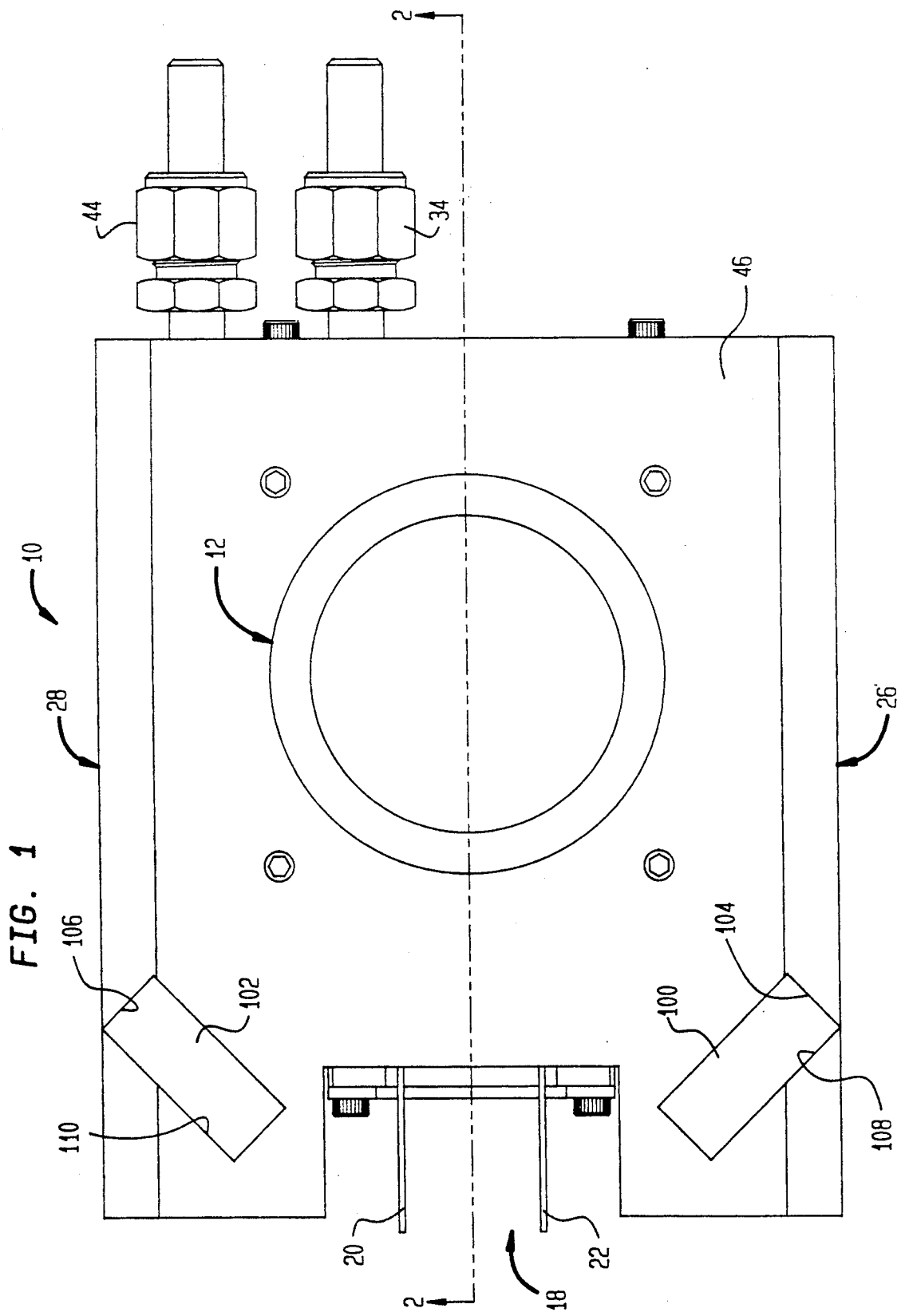
FIG. 1 is a top plan view of an electron beam source in accordance with the present invention.
Figure 2:
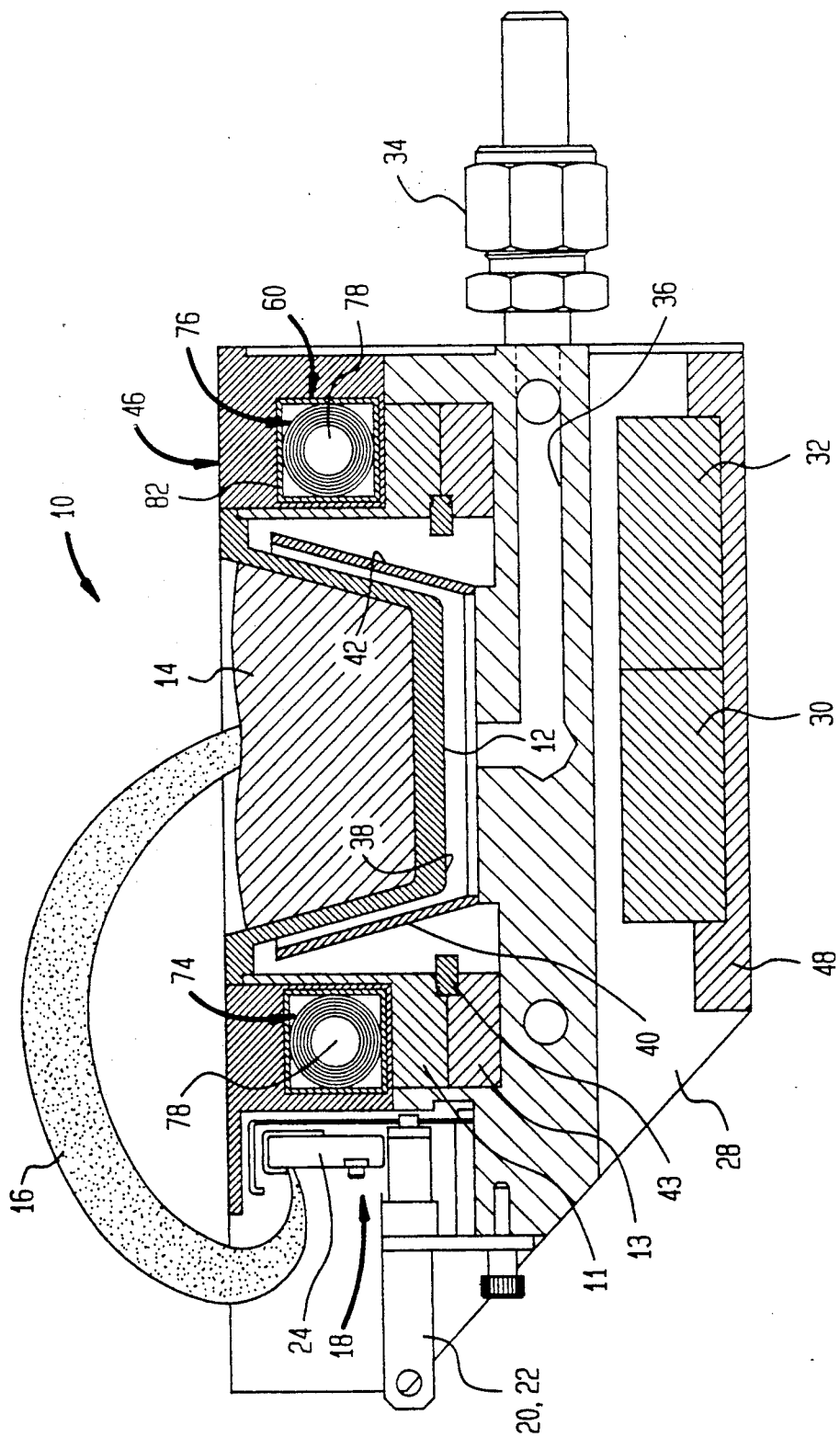
FIG. 2 is a cross sectional view of FIG. 1 taken along line 2—2.
Figure 3:
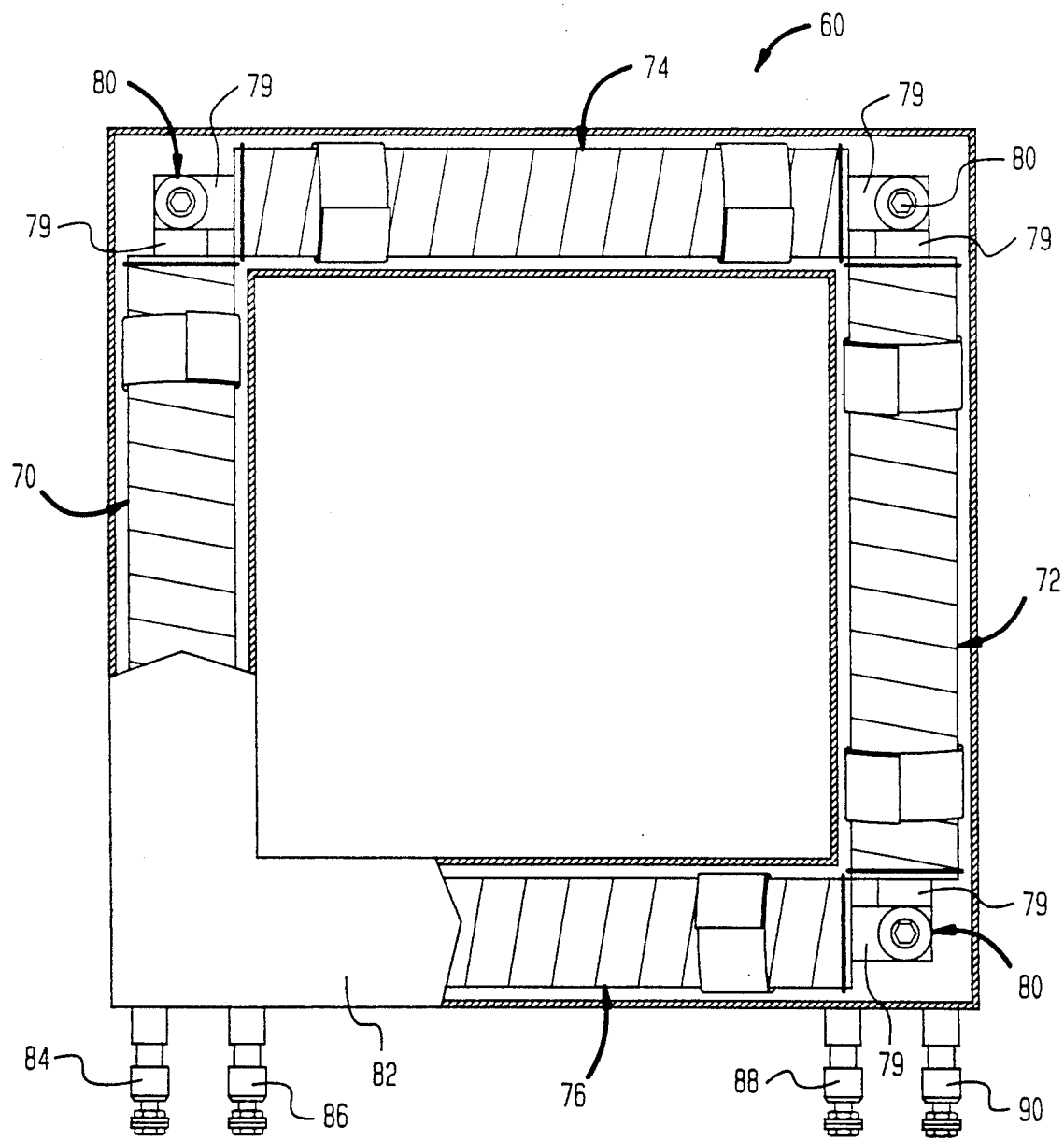
FIG. 3 is a top plan view of a quadrapole in accordance with the present invention with portions of a can-like container thereof broken away.

Referring now to FIGS. 1-3, a preferred embodiment of an electron beam evaporation source 10 in accordance with the present invention is illustrated. Although not illustrated, but as would be known by those skilled in the art, electron beam evaporation source 10 would be mounted within a vacuum enclosure with one or more substrates supported above electron beam evaporation source 10 by a suitable mounting.

Electron beam evaporation source 10 is provided with a crucible 12 of 175 cc. capacity that contains an evaporant 14. Crucible 12 is supported by a crucible flange 11 which is in turn supported on a mounting flange 13. Evaporant 14 is evaporated by an electron beam 16 generated by an electron beam gun 18 having electrical terminals 20 and 22 and an emitter 24 from which electron beam 16 emanates. Electron beam 16 is vertically deflected through an arc of approximately 270 degrees by provision of a pair of pole pieces 26 and 28 which are transversely connected by a pair of permanent magnets of 30 and 32 having a polarity in which the north pole of each of the magnets would extend from the page as viewed in FIG. 2. Each of the permanent magnets is formed from an ALNICO bar having a length of about 14.923 cm., a width of about 5.690 cm., a thickness of about 2.54 cm. and charged to produce a field of about 450.0 gauss.

Crucible 12 is cooled in a conventional manner by water entering electron beam evaporation source 10 through an inlet line fitting 34. The water flows through a water channel 36 and into an inner annular space 38 surrounding crucible 12 and formed by a shell-like baffle plate 40. The cooling water flows over the top of the baffle plate 40 into an outer annular space 42 surrounding baffle plate 40, between a copper gasket 43 and baffle plate 40, and then out of a water outlet channel, not illustrated, and an outlet line fitting 44. It is to be noted that copper gasket 43 is pinched between crucible flange 11 and mounting flange 14 to prevent the cooling water from leaking into the vacuum environment of the vacuum enclosure even in the case of subatmospheric pressures in the ultra high vacuum range. Pole pieces 26 and 28 are transversely connected at the top by a cover plate 46, which also serves to prevent the evaporant from spattering onto emitter 24, and at the bottom by a base plate 48, which also serves as a holder for magnets 30 and 32.

Figure 4:
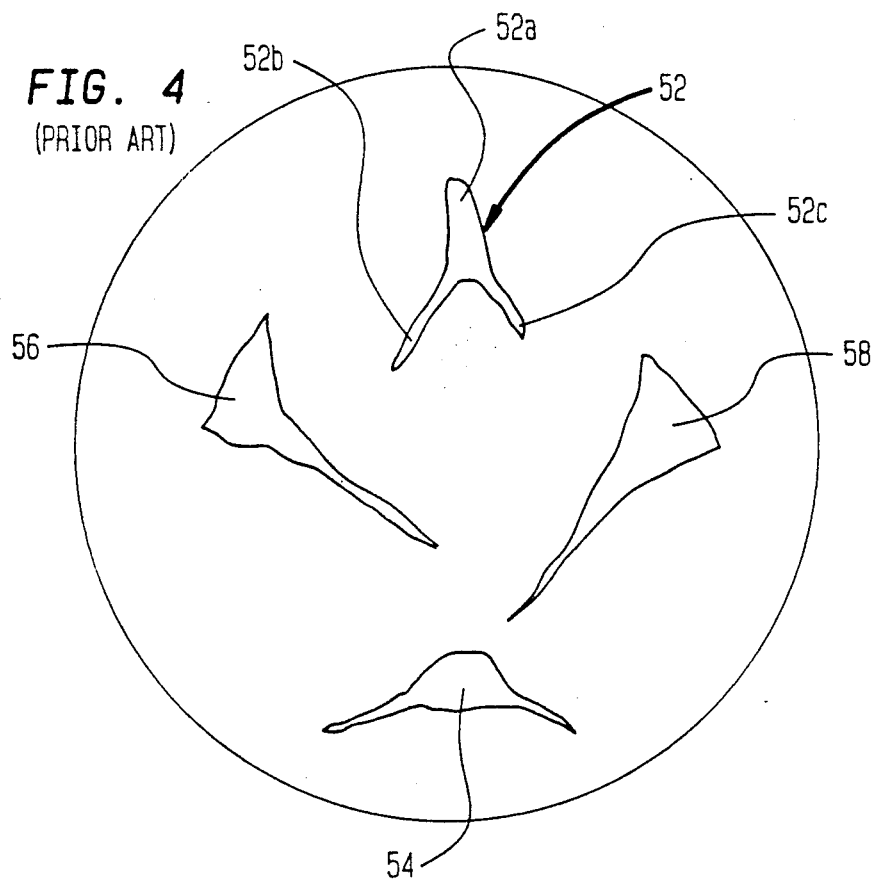
FIG. 4 illustrates the impact areas of an electron beam produced by a prior art electron beam evaporation source.

FIG. 4 represents impact areas of 52, 54, 56, and 58 of an electron beam upon the top surface of an evaporant to be evaporated within a crucible of a prior art electron beam evaporation source. Impact area 52 is at the 12 o'clock position of the crucible, furthest from the emitter impact area 54 is at the 6 o'clock position of the crucible, closest to the emitter, and impact areas 56 and 58, are at the and 3 o'clock positions of the crucible, closest to the pole pieces. As the electron beam moves further from the emitter, it tends to lengthen in a direction parallel to the pole pieces. Moreover, In any position of the impact area, the impact area can be characterized as having a dense head region and one or more tail regions. For instance, impact area 52 has a dense head region 52a with two trailing tail regions 52b and 52c. Impact area 54 is similar to impact area 52 but is flattened with the tail regions directed toward the pole pieces. Impact areas 56 and 58 tail off toward the pole pieces. If impact areas 52-58 are inspected, it is readily apparent that due to their distortion and lengthening they differ in size. Thus, the power density of the electron beam at the impact areas and the evaporation rate of the evaporant will also vary with the position of the particular impact area.

Figure 5:
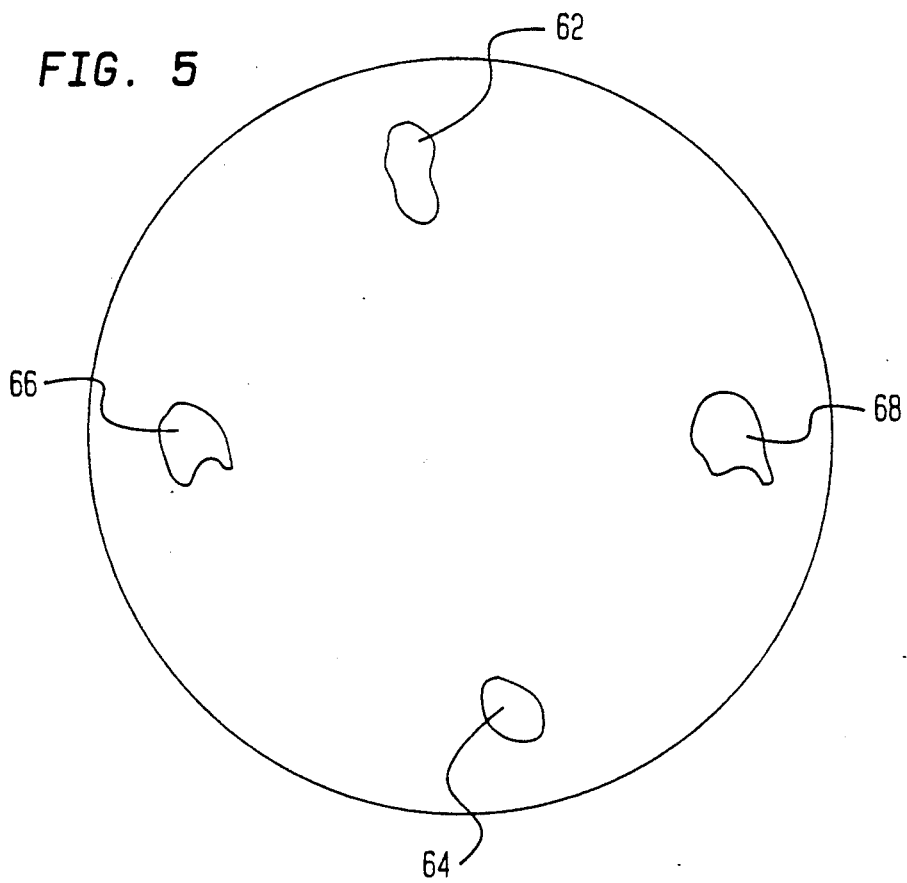
FIG. 5 illustrates the impact areas of an electron beam produced by a prior art a electron beam evaporation source incorporating a quadrapole of the present invention used in deflecting the electron beam in a horizontal plane.

The deflection of electron beam 16 in the horizontal plane is effectuated by the provision of a quadrapole 60. With reference to FIG. 5, impact areas 62 through 68 are illustrated in which an electron beam of a prior art electron beam evaporation source was deflected by a quadrapole similar in design and operation to quadrapole 60. In this regard, there exists a one to one correspondence in position between impact areas 62 and 52; 64 and 54; 66 and 56; and 68 and 58. As is evident, the distortion of the impact areas has been substantially eliminated. As will be discussed, the reason for such improvement is that the magnetic deflection field produced by quadrapole 60 is more uniform than that generated by the U-shaped arrangement of prior art electromagnets.

Quadrapole 60 comprises a set of two opposite pairs of electromagnets, 70 and 72; 74 and 76, connected end to end in a square-like configuration. Each electromagnet consists of a core 78 terminating in flat terminal ends 79, having a diameter of about 1.27 cm. and wound with 1480 turns of #24 AWG wire. Cores 78 are joined at terminal ends 79 by screws and hex nuts 80. As illustrated, quadrapole 60 is covered by a square-like can 82 hermetically sealed and filled with helium.

Electromagnet pairs 70 and 72., and 74 and 76 are wired in series and have a magnetic polarity in which the north poles are at the top ends of electromagnets 70 and 72 and are at the right ends of electromagnets 74 and 76 (as viewed in FIG. 3) when a positive current is applied to the windings of the electromagnets (through a pair of terminals 84 and 86 of electromagnets 70 and 72, with terminal 84 being the positive terminal; and through a pair of terminals 88 and 90 of electromagnets 74 and 76, with terminal 88 being the positive terminal.) As such, the electromagnets of electromagnet pair 70 and 72 act in concert and the electromagnets of electromagnet pair 74 and 76 act in concert. For instance, if an increasing positive current is applied to electromagnets 74 and 76, electromagnet 74 exerts a pushing force on electron beam 16 while electromagnet 76 exerts a pulling force on electron beam 16 to deflect electron beam 16 closer to emitter 24 and in a direction parallel to pole pieces 26 and 28. In this manner, quadrapole 60 provides a more uniform magnetic deflection field than the U-shaped arrangement of electromagnets in the prior art in which, for instance, only the transverse electromagnet serves to deflect the electron beam in a direction parallel to the pole pieces.

A current of about plus or minus one ampere at a voltage of about 15.0 volts is applied to terminals 84 and 86 of electromagnets 70 and 72 to deflect electronic beam 16 in a transverse direction to pole pieces 26 and 28 and/or is applied to terminals 88 and 90 of electromagnets 74 and 76 to deflect electron beam 16 in a direction parallel to pole pieces 26 and 28. There are many well-known commercially available power supplies that are capable of supplying the electrical power required for quadrapole 60. It is to be noted, however, that electromagnets could be individually powered instead of being wired in series. However, this would result in more complex control circuitry than is required in the illustrated preferred embodiment.

Although quadrapole 60 may be positioned near emitter 24, it is most preferably positioned around crucible 12. The advantage of such positioning is to prevent electron beam 16 from contacting electromagnets 70-76 and to make electron beam evaporation source more compact, that is to reduce its footprint. Additionally, magnets 30 and 32 are located beneath crucible 12 to also reduce footprint size.

Although quadrapole 60 substantially eliminates distortion of the impact areas, as is evident from FIG. 5, there remains a lengthening of the impact areas as electron beam 16 is deflected in the direction parallel to pole pieces 26 and 28 and away from emitter 24.

As mentioned previously, vertical deflection of the electron beam is produced by a transverse magnetic field extending from the top of the electron beam evaporation source. In prior art electron beam evaporation sources, it has been found by the inventor's herein that such transverse magnetic field has a nonuniform vertical gradient in the flux density that produces the aforementioned lengthwise deformation of the impact areas. The vertical nonuniformity in the flux gradient is produced because as the pole pieces approach magnetic saturation, the magnetic flux becomes self repellant. It further been found by the inventors herein that the nonuniformity in the vertical gradient of flux density can be reduced by providing pole pieces having a predetermined thickness and separation. Such reduction in the nonuniformity of the vertical gradient of flux density reduces the degree to which the impact areas are deformed in the lengthwise direction.

It is to be noted that there exists a limitation on the degree to which the pole pieces can be thickened. Electron beam 16 emanates from emitter 24 in a ribbon-like configuration. The magnetic field produced at the top of the pole pieces is transversely arched and tends to advangageously compress electron beam 16. As the pole pieces are thickened, the transverse arch of such magnetic field tends to become flattened. As may be appreciated, the flattening in the arch of the magnetic field tends to reduce the degree to which the electron beam is compressed. In the present invention, it has been found that pole pieces having a thickness of about 1.270 cm., as contrasted with 0.953 cm. thickness of prior art pole pieces, and a separation of about 15.875 cm. optimally reduce such lengthwise deformation of the impact area of electron beam 16 when repositioned through horizontal beam deflection effecuated by quadrapole 60. It is to be noted that since magnets 30 and 32 each have a length of about 14.923 cm., pole pieces 26 and 28 are inwardly stepped at the level of magnets 30 and 32 so as to make contact therewith.

Figure 6:
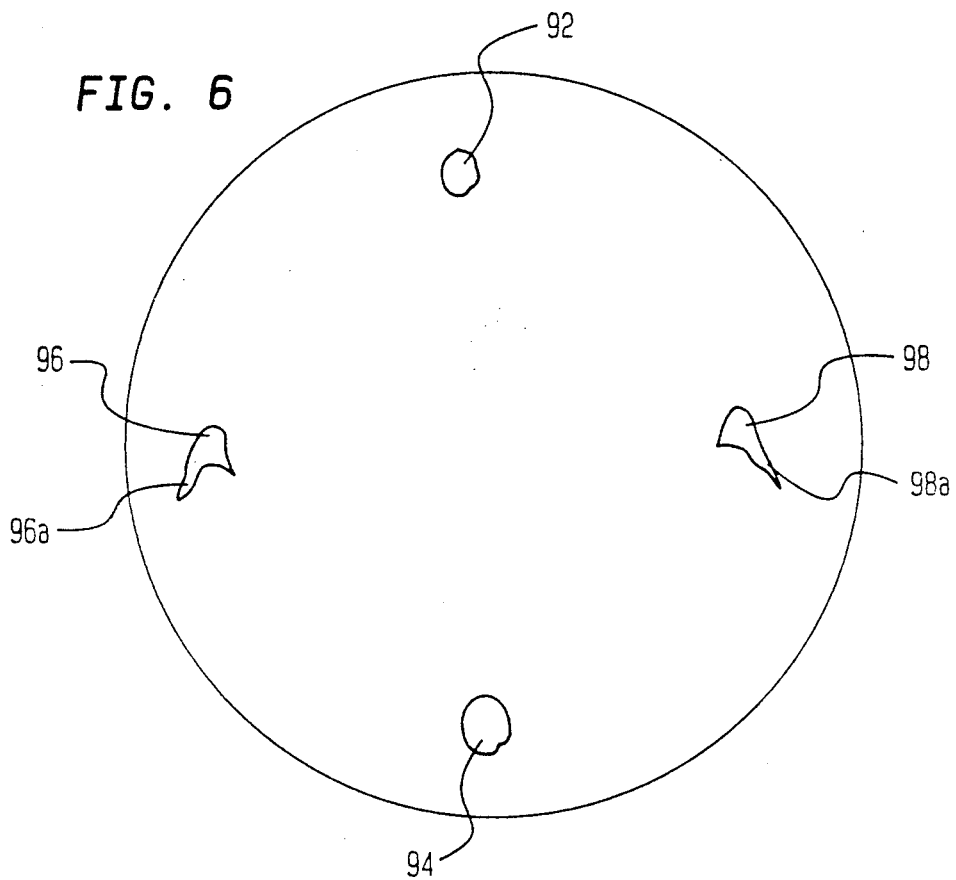
FIG. 6 illustrates the impact areas of an electron beam produced by the electron beam evaporation source of FIG. 5 further incorporating pole pieces designed in accordance with the present invention.

FIG. 6 illustrates the impact areas of an electron beam evaporation source incorporating both the quadrapole of the present invention and the pole pieces of the present invention. There exists a direct correlation in the position between impact areas 92 and 52; 94 and 54; 96 and 56; and 98 and 58. It is apparent from this figure that the lengthwise deformation of the impact areas has been eliminated. However, impact areas 96 and 98, at points of extreme transverse horizontal deflection of the electron beam now have tail regions 96a and 98a. In accordance with the present invention, such tail regions 96a and 98a are substantially eliminated by the provision of a pair of surface dipoles 100 and 102.

Surface dipoles 100 and 102 are connected, at one end, to pole pieces 26 and 28 at an angle of about 45 degrees and are located along pole pieces 26 and 28 such that electron beam 16 passes between the other of the ends of the pole pieces at a near vertical location of the arc of electron beam 16. Without being held to a specific theory of operation, it is believed by the inventors herein that the tail regions are formed by divergence of the electron beam and by the strength of the magnetic field near the pole pieces which tends to attract the ends of the beam. In accordance with this theory, the surface dipoles are thought to provide a concentrated magnetic field near the origination of electron beam 16 to prevent substantial divergence of electron beam 16 while at the same time reducing the magnetic field strength near pole pieces 26 and 28.

Preferably, each surface dipole comprises a shim-like member of about 0.318 cm. thick×1.905 cm. wide×4.763 cm. long. Surface dipoles 100 and 102 are respectively set into cutouts 104 and 106 located in the top of pole pieces 26 and 28 and adjoining cutouts 108 and 110 located in cover plate 46. It has been found that as the length of the dipoles is increased, more energy is required to horizontally deflect the electron beam. Hence, the aforementioned length dimension in the formation of surface dipoles 100 and 102 has been found to be optimum.

Figure 7:
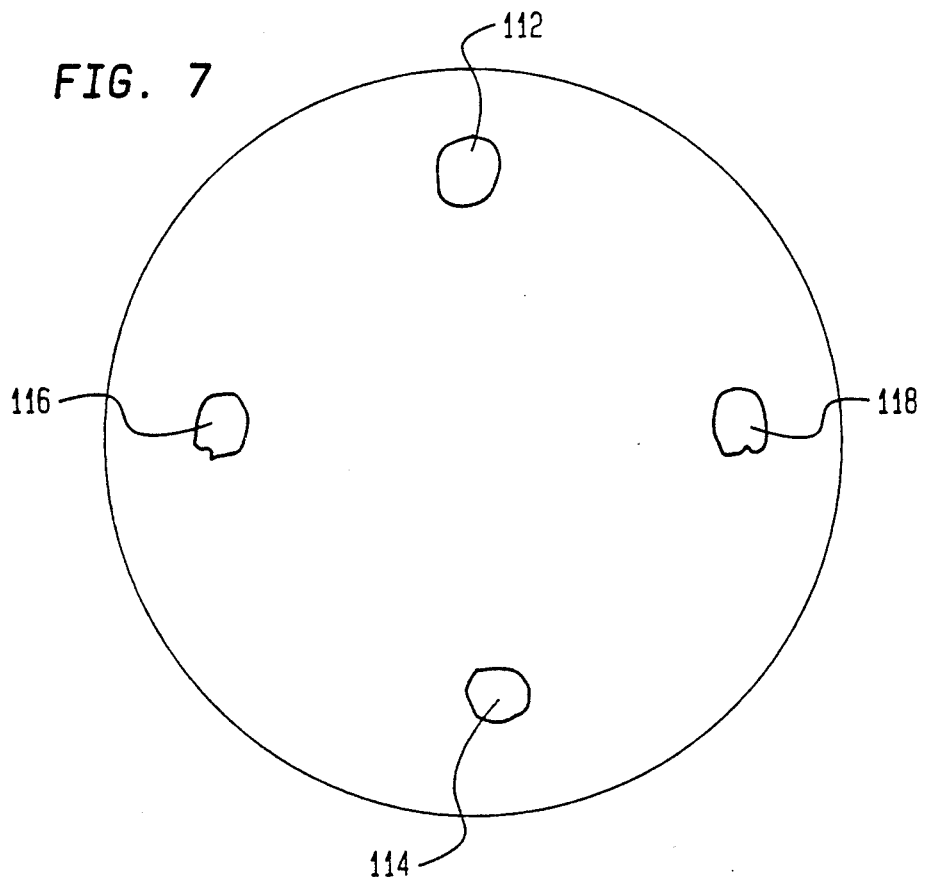
FIG. 7 illustrate the impact areas of an electron beam produced by the electron beam evaporation source of FIG. 6 further incorporating a pair of surface dipoles in accordance with the present invention.

FIG. 7 illustrates the impact areas of electron beam evaporation source 10. There exists a one to one correspondence in crucible position between impact areas 112 and 52; 114 and 54; 116 and 56; and 118 and 58. If such impact areas are compared, it is readily seen that impact areas 112-116 are roughly the same size, without substantial lengthwise deformation, parallel to pole pieces 26 and 28, and without the formation of substantial tail regions. Since impact areas 112-116 are produced by extreme magnetic deflection of electron beam 16, all other possible positions of impact area will be produced by less magnetic deflection; and thus, will also have impact areas of similar size to impact areas 112-116. As a result, the evaporation rates of evaporant 14 will remain essentially constant in any position of the impact area.

Although preferred embodiments have been shown and described in detail, it will be readily understood and appreciated by those skilled in the art that numerous omissions, changes, and additions may be made without departing from the spirit and scope of the invention.

We claim:

1. In an electron beam evaporation source having, a crucible for containing an evaporant, electron beam gun means generating an electron beam impacting the evaporant at an impact area thereof for evaporating the evaporant, a pair of pole pieces located along opposite sides of the crucible, magnetic field means transversely connecting the pole pieces and generating a magnetic field across the pole pieces for vertically deflecting the electron beam through an arc of about 270° and into the crucible, and magnetic positioning means for selectively deflecting the electron beam in a horizontal plane so that the impact area of the electron beam on the evaporant may be repositioned to fully utilize the evaporant, the improvement comprising:

the magnetic deflection means comprising a quadrapole having a set of two opposite pairs of electromagnets, attached end to end in a square-like configuration, located so that the electron beam passes between the two pairs of electromagnets, wired and oriented such that the electromagnets of one of the pairs of electromagnets act in concert to deflect the electron beam in a first direction, parallel to the pole pieces, and the electromagnets of the other of the pairs of electromagnets act in concert to deflect the electron beam in a second direction, transverse to the pole pieces, to provide a substantially uniform magnetic deflection field to horizontally deflect the electron beam and thereby to prevent substantial distortion of the impact area that would otherwise occur when repositioned;

the pole pieces having a preselected thickness and a preselected separation to produce a reduced vertical gradient in the flux density of the magnetic field above the electron beam evaporation source sufficient to prevent lengthening of the impact area that would otherwise occur when the electron beam is deflected in the first direction and away from the electron beam gun means;

the pole pieces producing tail regions in the impact area at the extreme transverse positions of deflection of the electron beam in the second direction; and a pair of surface dipoles connected, at one end, to the pole pieces at an angle of about 45 degrees and positioned along the pole pieces so that the electron beam passes between the other of the ends of the pair of surface dipoles when in an essentially vertical location of the arc of the electron beam to substantially prevent the formation of the tail regions in the impact area at the extreme transverse positions of deflection of the electron beam in the second direction, whereby the maintenance of the impact area substantially free of distortion, lengthening, and the formation of tail regions will ensure that the size of the impact area and thus, the power density of the electron beam at the impact area and the evaporation rate of the evaporant will remain essentially constant in any position of the electron beam.

2. The improvement of claim 1, wherein the magnetic field means comprises a pair of permanent magnets positioned beneath the crucible and the quadrapole is located around the crucible to reduce the footprint of the electron beam evaporation source.

3. The improvement of claim 1, wherein each of the pairs of electromagnets are wired in series such that a biased current can be applied to each of the pairs of electromagnets to deflect the electron beam in the first and second directions.

4. The improvement of claim 1, wherein the predetermined thickness of the pole pieces is about 1.27 cm. and the predetermined separation of the pole pieces is about 15.875 cm.

5. The improvement of claim 1, wherein the surface dipoles have a length of about 4.763 cm.

* * * * *